United States Statutory Invention Registration [19]

[11] Reg. Number: H97

O'Connor [45] Published: Aug. 5, 1986

[54] ROW-ADDRESS-DECODER-DRIVER CIRCUIT

[75] Inventor: Kevin J. O'Connor, Center Valley, Pa.

[73] Assignee: AT&T Bell Laboratories, Murray Hill, N.J.

[21] Appl. No.: 451,786

[22] Filed: Dec. 21, 1982

[51] Int. Cl.[4] ..... G11C 8/00
[52] U.S. Cl. ..... 365/230; 307/449
[58] Field of Search ..... 365/189, 230; 307/449, 307/463, DIG. 4, DIG. 5

[56] References Cited

U.S. PATENT DOCUMENTS

| | | | |
|---|---|---|---|
| 4,042,838 | 8/1977 | Street et al. | 307/270 |
| 4,071,783 | 1/1978 | Knepper | 307/270 |
| 4,250,414 | 2/1981 | Kirsch | 307/296 A |
| 4,317,051 | 2/1982 | Young, Jr. | 307/246 |
| 4,398,102 | 8/1983 | Stewart | 365/230 X |
| 4,417,163 | 11/1983 | Otsuki et al. | 365/230 X |

FOREIGN PATENT DOCUMENTS 0045133 6/1981 European Pat. Off. .

*Primary Examiner*—S. C. Buczinski
*Assistant Examiner*—Linda J. Wallace
*Attorney, Agent, or Firm*—James H. Fox

[57] ABSTRACT

A static noninverting driver circuit is used with a standard static address-row-decoder circuit in order to provide capacitance load drive capability and relatively high-speed operation. The driver circuit uses n-channel enhancement and depletion mode field effect transistors and a feedback bootstrap capacitor to achieve low power-high speed operation with a full VDD output high level.

15 Claims, 2 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

ROW-ADDRESS-DECODER-DRIVER CIRCUIT

FIELD OF THE INVENTION

This invention relates to memories and, in particular, to relatively high speed-low power driver circuits used with address decoders.

BACKGROUND OF THE INVENTION

Some row-address-decoders used with static field effect transistor memories have the serial combination of a load resistor (typically a depletion transistor) and a plurality of enhancement address decoder transistors. For proper operation, the ohmic value of the load resistor is selected to be high relative to the resistance of each of the enhancement transistors. The total resistance of the load resistor and any one of the enhancement transistors is selected to be relatively high in order to keep power dissipation relatively low. This results in output voltage rise times that are slower than is desirable in some applications in which capacitance loads must be driven. Decreasing the ohmic value of the load resistor and enhancement transistor improves rise time, but at the expense of a considerable increase in power dissipation. The trade-off between improved rise time and increased power dissipation is not favorable in some applications.

It would be desirable to have a row-address-decoder circuit which has a driver stage that can provide relatively fast operation with relatively low power dissipation and output voltage logic levels which are close to or at the potential levels of power supplies used with the circuit.

SUMMARY OF THE INVENTION

The circuitry of the present invention is directed to a high speed-low power dissipation noninverting driver circuit which provides output signal levels that are typically approximately the same as two potential levels used to power the circuitry. One particularly useful application for the circuitry is as an output driver for a static row-address-decoder.

One embodiment of the circuitry of the present invention comprises first, second, and third inverter circuits, a delay circuit means, a capacitor circuit means, a potential setting circuit means, and a coupling/decoupling switching device having a control terminal and first and second output terminals. An input terminal of the first inverter circuit serves a circuitry input terminal, and an output terminal of the third inverter circuit serves as a circuitry output terminal. An output terminal of the first inverter circuit is coupled to an input terminal of the second inverter circuit and to a first input terminal of the third inverter circuit. An output terminal of the second inverter circuit is coupled to a second input terminal of the third inverter circuit and to the second output terminal of the coupling/decoupling switching device. The potential setting circuit means is coupled to a first terminal of the capacitor circuit means and to the first output terminal of the coupling/decoupling switching device. The delay circuit means is coupled by a first terminal to the input terminal of the second inverter circuit and is coupled by a second terminal to the second terminal of the capacitor circuit means.

Some row-address-decoder circuits may have an inverter circuit, like the first inverter circuit of the above-described embodiment, as the output stage thereof. In such case, the first inverter circuit of the above-described embodiment can be eliminated with the input terminal of the above second inverter circuit now serving as the circuitry input terminal. This modified embodiment acts as an inverter driver circuit which otherwise essentially has the same features as the above-described embodiment.

The capacitor circuit means and the coupling/decoupling switching device of both embodiments cooperate to selectively help cause the circuitry to develop an output potential which is at essentially the same potential level as one of the potential sources used to power the circuitry.

Viewed from another aspect, the above circuitry, as modified, comprises first, second, third, and fourth switching devices, a coupling/decoupling switching device, with each having a control terminal and first and second output terminals, a capacitor circuit means having first and second terminals, a potential setting circuit means coupled to the first output terminal of the coupling/decoupling switching device and to the first terminal of the capacitor circuit means, and a delay circuit means. A circuitry input terminal is coupled to the control terminals of the second and fourth switching devices, and a circuitry output terminal is coupled to the second output terminal of the third switching device and to the first output terminal of the fourth switching device. First and second terminals of the delay circuit means are coupled to an input terminal of the second switching device and to the second terminal of the capacitor circuit means.

These and other novel features and advantages of the present invention are better understood from consideration of the following detailed description taken in conjunction with the accompanying drawings.

DETAILED DESCRIPTION

Figure 1:
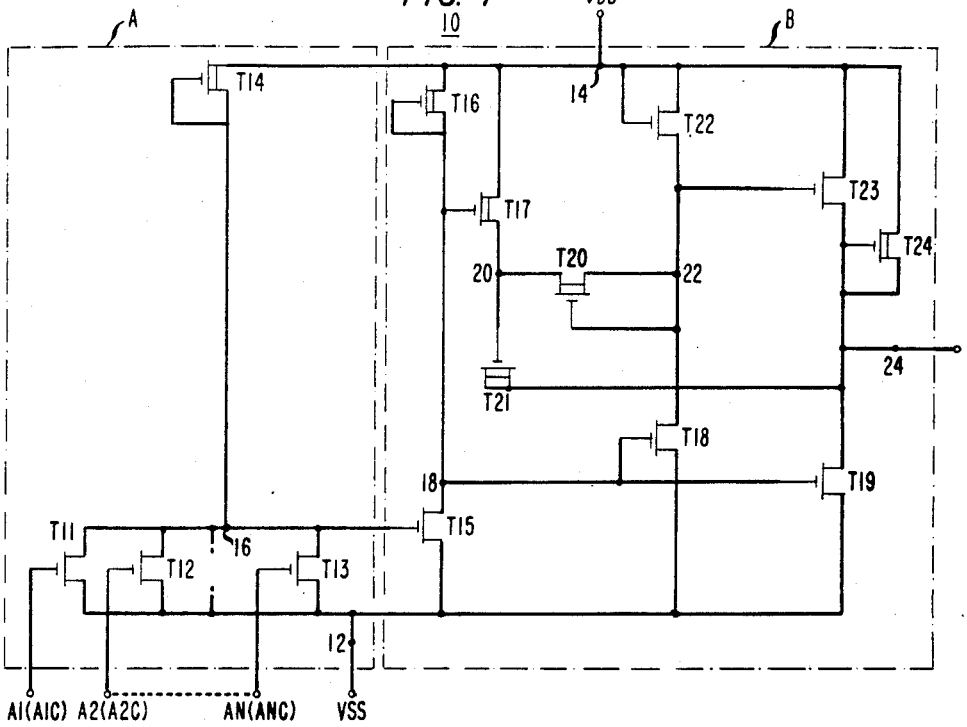
FIG. 1 illustrates circuitry in accordance with one embodiment of the present invention.

Referring now to FIG. 1, there is illustrated a row-address-decoder-driver circuit 10 which comprises a standard static row-address-decoder circuit (illustrated within dashed line rectangle A) coupled by an output node 16 to a driver circuit (illustrated within dashed line rectangle B). The driver circuit (B) acts as a relatively high speed and low power noninverting buffer circuit which provides at an output terminal 24 a signal which is essentially the same as appears at output node 16 of row-address-decoder circuit (A). Terminal 24 also serves as the output terminal of row-address-decoder-driver circuit 10.

Row-address-decoder circuit (A) comprises essentially a plurality of address decoder field effect transistors of which only three, T11, T12, and T13, are illustrated and a first load transistor T14. Driver circuit (B) comprises essentially field effect transistors T15, T16, T17, T18, T19, T20, T21, T22, T23, and T24.

The gate of T11 is coupled to input row address information source A1 or its complement A1C; the gate of T12 is coupled to input row address information source A2 or its complement A2C; and the gate of T13 is coupled to input row address information source AN or its complement ANC. The drains of T14, T16, T17, T22, T23, and T24 are coupled together to a terminal 14 and a potential voltage source VDD. The sources of T11, T12, T13, T15, T18, and T19 are coupled to a terminal 12 and to a potential source VSS, which is typically, but not necessarily, ground potential. The gate and source of T14 are coupled to the drains of T11, T12, and T13, to the gate of T15, and to a node 16. The gate and source of T16 are coupled to the gates of T17, T18, and T19, to the drain of T15, and to a node 18. The source of T17 is coupled to the drain of T20, to the gate of T21, and to a node 20. The source of T22 is coupled to the gate and source of T20, to the drain of T18, to the gate of T23, and to a node 22. The drain and source of T21 are coupled together to the sources of T23 and T24, to the gate of T24, to the drain of T19, and to output terminal 24.

T21 acts essentially as a capacitor. It is illustrated as a depletion mode transistor, with the drain and source coupled together to output terminal 24. As such, a channel essentially exists between the drain and source so long as the gate is not at a potential less than one depletion mode threshold below the potential of the drain and source. The VDD and VSS potentials and circuitry (B) are selected such that T21 always has a channel between the drain and source thereof. The gate is one terminal and the drain and source are the other. T21 is used essentially as a feedback bootstrap capacitor. T14 and T11, T12, and T13 are designed such that with T14 biased on (as is normally the case because it is a depletion mode transistor) and any one of T11, T12, or T13 are biased on, conduction occurs through T14, and the biased on one of T11, T12, or T13, and the potential of node 16 is close to VSS. With T14 biased on and T11, T12, and T13 biased off, node 16 is at or close to VDD.

T15 and T16 are designed such that with both biased on (enabled) and conducting, the potential of node 18 is close to VSS, and with T15 off, the potential of node 18 is at or near the level of VDD. T17, T18, T20, and T22 are designed such that with all biased on (enabled) and conducting, the potential of node 22 is close to VSS, and with T18 biased off, node 22 is at or close to VDD. T19, T23, and T24 are designed such that when all are biased on (enabled) and conducting, the potential of output terminal 24 is at or close to VSS, and with T19 biased off, output terminal 24 is at or close to VDD.

The drain and source nodes (terminals) of the transistors described are so denoted to reflect positive current flow from drain to source. If current flows in the reverse direction, the denotations of drain and source reverse.

In one embodiment, T11, T12, T13, T15, T18, T19, T22, and T23 are enhancement mode n-channel insulated gate field effect transistors, and T14, T16, T17, T20, T21, and T24 are depletion mode n-channel insulated gate field effect transistors.

T11, T12, T13, and T14 form a first inverter circuit. With any of A1 (A1C), A2 (A2C), or AN (ANC) high, node 16 is low, and with all of same low, node 16 is high. T15 and T16 form a second inverter circuit. With the gate of T15 (node 16) high, node 18 is low, and with the gate of T15 (node 16) low, node 18 is high. T17, T20, T22, and T18 form a third inverter circuit. With the gate (node 18) of T18 high, node 22 is low, and with the gate (node 18) of T18 low, node 22 is high. T19, T23, and T24 form a fourth inverter circuit. With the gate (node 18) of T19 high, output terminal 24 is low, and with the gate (node 18) of T19 low, output terminal 24 is high.

The second and fourth inverter circuits are coupled together, with node 18 serving as an output terminal of the second inverter circuit and as an input terminal of the fourth inverter circuit. The fourth inverter circuit acts essentially as a delay element which couples node 18 to output terminal 24. T17, T20, and T21 cooperate to selectively allow the potential of node 22 to be increased above VDD by at least one threshold voltage such that the full level of VDD can selectively pass through T23 and appear at output terminal 24. T24 serves to selectively hold the potential of output terminal 24 at VDD after node 22 decreases below the level of VDD plus one threshold voltage. T17 may be denoted as a potential setting circuit means; T20 may be denoted as a coupling/decoupling switching device; T21 may be denoted as a capacitor circuit means. All other transistors may be denoted as switching devices.

As is well known to workers in the art, a particular row-address-decoder (A) of the type shown is selected when all of the inputs to the decoding transistors T11, T12, and T13, supplied from input row address information sources A1 (A1C), A2 (A2C), AN (ANC), respectively, are low, "0's" (at or near VSS), in which case node 16 is high, a "1" (at or near VDD), since T14 is biased on, and T11, T12, and T13 are biased off. If the particular row-address-decoder (A) is to be deselected (not selected), one of the inputs thereto is high, a "1". In this case one of T11, T12, or T13 is biased on, and the voltage on node 16 drops to approximately VSS, a "0".

One problem with using node 16 to directly drive capacitive loads (not illustrated) is that rise time is poorer than desired in some applications. T14 is designed to have relatively high resistance compared to T11, T12, or T13 to ensure proper operation, and T14 and T11, T12, and T13 are designed to have a relatively high total resistance so as to keep power dissipation low. The relatively large resistance of T14 degrades the rise time of voltage waveforms appearing at node 16. Reducing the resistance of T14 improves the rise time but also increases power dissipation. The tradeoff between improved rise time and increased power dissipation is not favorable in some applications.

Driver circuit (B), which has the gate of T15 coupled to node 16, provides fast rise times and has relatively low power dissipation. The lowering of the resistance of T14 and T11, T12, and T13 such that the additional power dissipation is approximately equal to that consumed by the driver circuit (B) and would still not, in some applications, provide the same rise time at node 16 that results at node 24.

The basic operation of driver circuit (B) is as follows: assuming node 16 is at or close to VSS, a "0", and therefore T15 is biased off and T18 and T19 are biased on since node 18 is at or close to VDD. Accordingly, node 22 and output terminal 24 are both set to a potential level at or close to VSS, a "0". This biases off T23 and helps ensure that output terminal 24 is at or near VSS. T17 is heavily biased on and tends to set the potential of node 20 to a level at or close to VDD. T20 is biased on relatively weakly and acts as a relatively high resistance that allows some limited current to flow from VDD through T17 and T20, and then through T18 to VSS. Ideally, it is desired that T20 essentially completely decouple nodes 20 and 22 at this time. T20 acts to drop most of the voltage difference between VDD and VSS across the drain (node 20) and source and gate (node 22) thereof. Thus, terminal 22 stays at a potential close to VSS.

Now assume the potential of node 16 changes from a potential at or near VSS to a potential at or near VDD. This biases T15 on and causes node 18 to be set to a potential at or near VSS. This biases off T18 and T19 and reduces the on biases of T17 which increases the resistance between the drain and source thereof. This tends to effectively to a degree decouple node 20 from VDD. Ideally, it is desired to completely decouple node 20 from VDD at this time. As T18 and T19 turn off, the potentials of nodes 22 and 24 start to increase from at or near the level of VSS towards the level of VDD. As the potential of node 22 reaches one threshold voltage above VSS, T23 becomes biased on. Output terminal 24 now begins to also increase in potential from a level at or near VSS towards VDD. Output terminal 24 is also set in potential to VDD by T24. This positive increase in potential of terminal 24 is capacitively coupled through T21 to node 20 and then through the drain-source of T20 to node 22. T20 is more heavily biased on at this time, and accordingly its resistance between drain and source is reduced. T20 can be said to couple nodes 20 and 22 together at this time. Nodes 20 and 22 are both increased in potential from a level at or close to VDD to a level at least one threshold voltage above VDD. This increases the on bias on T23 and allows output terminal 24 to assume the full VDD potential level, a "1". T23 serves to provide most of the transient of charge necessary to drive (charge) load capacitance (not illustrated) coupled to output terminal 24. T24 serves to hold the potential of output terminal 24 at the full VDD level after the current transient has passed. T24, by itself, typically has too high a resistance to provide the needed transient current quickly enough to allow as rapid a rise time as is desired in many applications.

Figure 2:
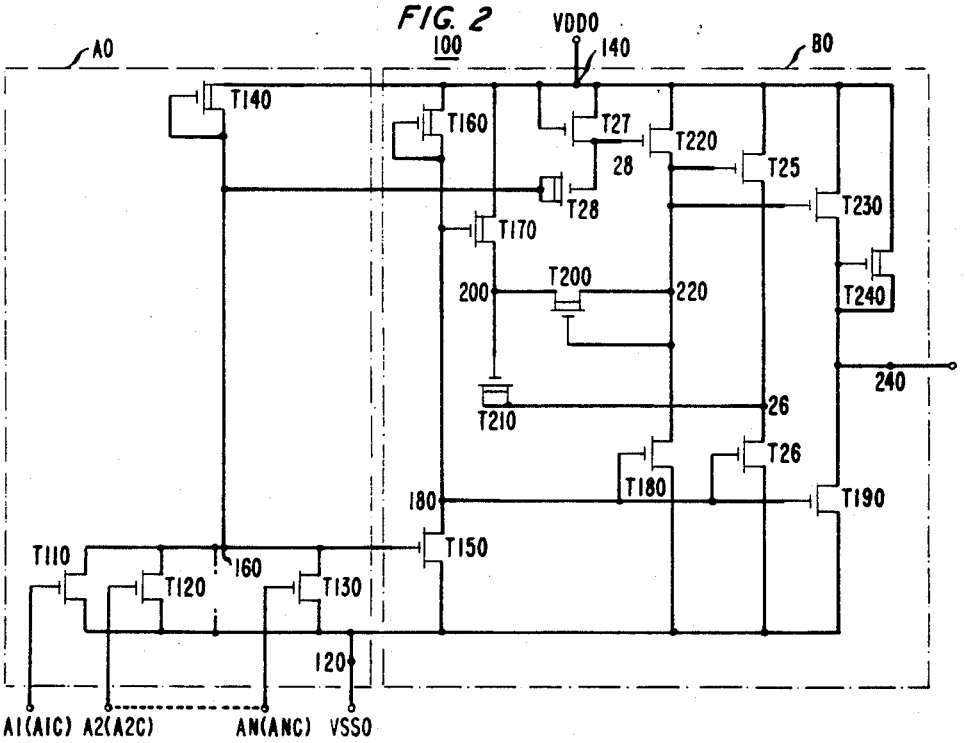
FIG. 2 illustrates another embodiment of circuitry in accordance with the present invention.

Referring now to FIG. 2, there is illustrated another row-address-decoder-driver circuit 100 which comprises a standard static row-address-decoder circuit (illustrated within dashed line rectangle A0) coupled by an output node 160 to a driver circuit (illustrated within dashed line rectangle B0). Row-address-decoder circuit (A0) is essentially the same as row-address-decoder (A) of FIG. 1, and all components and nodes and/or terminals which correspond have the same reference identification, with an extra "0" added. Driver circuit (B0) is very similar to driver circuit (B) of FIG. 1, with corresponding components and nodes and/or terminals having the same reference identification, with an extra "0" added.

Driver circuit (B0), in addition to having all the components of FIG. 1, also includes field effect transistors T25, T26, T27, and T28. In one embodiment, T25, T26, T27, and T28 are all n-channel insulated gate field effect transistors. The drain of T25 and the source of T26 are coupled to terminal 140 and potential source VDD0 and to terminal 120 and potential source VSS0, respectively. The source of T25 is coupled to the drain of T26, to a terminal 26, and to the drain and source of T210, which is configured so as to function as a capacitor, as does corresponding T21 of FIG. 1. The gates of T25 and T26 are coupled to nodes 220 and 180, respectively. T25 and T26 serve as a buffer stage which permits the drain and source of T210 to be coupled to node 26 instead of output terminal 240, as is the case of the drain and source of T21 of FIG. 1 which are coupled to output terminal 24. The coupling of the drain and source of T210 to node 26, instead of output terminal 240, serves to insolate the capacitance of T210 from load capacitance (not illustrated) coupled to output terminal 240. This speeds up the operation of driver circuit (B0) in that node 26 can change in potential faster than output terminal 240 since its only load capacitance is the parasitic capacitances (not illustrated) of the source of T26, the drain of T27, and the capacitance of T210. T25 and T26 also act as an inverter circuit. With the gate (node 180) of T26 high, node 26 is low, and with the gate (node 180) of T26 low, node 26 is high. T190, T230, and T240 also form an inverter circuit. Since the gates of T25 and T230 are coupled to the same node 20, the gates of T190 and T26 are coupled to the same node 180, the drains of T25, T230, and T240 are coupled to the same terminal 140, and the sources of T26 and T190 are coupled to the same terminal 120, node 26 and 240 both make voltage swings in the same direction. T27, T28, T170, T180, T200, T210, and T220 form another inverter circuit. With the gate (node 180) of T180 high, node 220 is low, and with the gate (node 180) of T180 low, node 220 is high. T26 acts essentially as a delay element which couples node 180 to node 26.

The gate of T220 is coupled to the source of T27, to the gate of T28, and to a node 28. The drain and gate of T27 are coupled together to terminal 140 and to potential source VDD0. T28, which has the drain and source coupled to node 160, acts as a feed-forward bootstrap capacitor. T27 and T28 both serve to allow node 220 to more rapidly selectively charge to a potential above VDD0 than can corresponding node 22 of FIG. 1.

A static 4K RAM which uses 64 of the row-address-decoder-driver circuits 100 of FIG. 2, with transistors T110, T120, T130, T150, T180, T190, T220, T230, T25, T26, and T27 being n-channel type enhancement mode field effect transistors and with transistors T28, T140, T160, T170, T200, T210, and T240 being n-channel type depletion mode insulated gate field effect transistors, has been fabricated. The effective channel length of all enhancement mode transistors is 0.6 microns, and that of all the depletion mode transistors are 0.9 microns, except for T240 which has an effective channel length of 5 microns and T210 and T28 which have a channel area of 150 and 4 square microns, respectively. The channel widths of T110, T120, T130, T140, T150, T160, T170, T180, T190, T200, T220, T230, T25, T26, and T27 are 1.5, 1.5, 1.5, 1.5, 9, 6, 7.25, 6, 15, 3, 4, 40, 15, 4, and 1 micron, respectively. VDD0 = +2.5 volts, and VSS0 = 0 volts. The fabricated row-address-decoder-driver circuits have been tested and found to be fully functional. Power dissipation of row-address-decoder circuit (A0) and driver circuit (B0) is approximately 0.5 and 0.5 milliwatt, respectively. The rise time (10% to 90%) of output waveforms appearing at output terminal 240, with a capacitive load on output terminal 240 of 0.3 picofarads, is approximately 0.75 nanosecond. The rise time (10% to 90%) of input address signals applied to the gates of T11, T12, and T13 is approximately 1.2 nanoseconds. The stage delay (time from the point at which a signal appearing at the gate of T11, T12, or T13 reaches 50% of the transition from one logic state to the other until the output signal appearing at output terminal 240 reaches 50% of the transition from one logic level to the other), with a capacitive load on output terminal 240 of 0.3 picofarads, is approximately 1.2 nanoseconds. The overall size of the fabricated row-address-decoder-driver circuit is approximately 600 square microns, with the driver circuit itself having an approximate area of 400 square microns.

The embodiments described herein are intended to be illustrative of the general principles of the invention. Various modifications are possible consistent with the spirit of the invention. For example, T14, T140, T16, T160, T17, and T170 could be enhancement mode transistors with each gate thereof coupled to the drain instead of depletion mode transistors with each gate coupled to the source thereof. Still further, T20 and T200 could be enhancement mode transistors with the gates coupled to voltage pulse circuitry (not illustrated) instead of depletion mode transistors with each gate coupled to the source. Such voltage pulse circuitry would have the capability of supplying the appropriate polarity and magnitude of potentials to selectively bias the coupled transistor on and off and to permit a potential level above VDD at nodes 20 and 200 to be coupled to nodes 22 and 220. Still further, driver circuits (B) and (B0) can be driven by a variety of other types of row-address-decoder circuits, or column-address-decoder circuits, or a variety of other types of circuits. Still further, T21, T210, and T28 can be replaced by a variety of different types of capacitors. Still further, T15 and T16 could be considered a part of a row-address-decoder circuit, with the driver circuit of the present invention then comprising transistors T17, T18, T19, T20, T21, T22, T23, and T24. Still further, T150 and T160 could be considered a part of a row-address-decoder circuit, with the driver circuit of the present invention then comprising transistors T170, T180, T190, T200, T210, T220, T230, T240, T25, T26, T27, and T28. The so-modified circuitries, which are in accordance with the present invention, are inverter driver circuits which essentially have all the advantages of the original circuitry.

What is claimed is:

1. Circuitry comprising:

a first inverter circuit having an input terminal and an output terminal;

a second inverter circuit having an input terminal and an output terminal;

a third inverter circuit having first and second input terminals and an output terminal;

a first capacitor circuit means having first and second terminals;

a potential setting circuit means coupled to the first terminal of the capacitor circuit means for selectively setting the potential thereof to a first preselected level;

the input terminal of the first inverter circuit being coupled to a circuitry input terminal;

the output terminal of the first inverter circuit being coupled to the input terminal of the second inverter circuit and to the first input terminal of the third inverter circuit;

delay circuit means being coupled by a first terminal to the output terminal of the first inverter circuit and being coupled by a second terminal to the second terminal of the capacitor circuit means; and a coupling/decoupling switching device having a control terminal and first and second output terminals, the first output terminal thereof being coupled to the first terminal of the capacitor circuit means and the second output terminal thereof being coupled to the second input terminal of the third inverter circuit and to the output terminal of the second inverter circuit and the control terminal thereof being connected to a potential source that allows an increase in potential on the first terminal of the capacitor circuit means to be coupled to the second output terminal of the switching device, and wherein said second inverter includes a switching device (T22, T220) that is connected to the output terminal of said second inverter and to a voltage source (VDD) that tends to bias said coupling/decoupling switching device towards conduction.

2. The circuitry of claim 1 wherein:

the first inverter circuit comprises essentially first and second switching devices each having a control terminal and first and second output terminals;

the second inverter circuit comprises essentially third and fourth switching devices each having a control terminal and first and second output terminals;

the third inverter comprises essentially fifth and sixth switching devices each having a control terminal and first and second output terminals;

the control terminal of the second switching device being coupled to the circuitry input terminal;

the control terminal of the fifth switching device being coupled to the second output terminal of the third switching device, to the first output terminal of the fourth switching device, to the output terminal of the second inverter circuit, and to the second output terminal of the coupling/decoupling switching device;

the first capacitor circuit means comprises a seventh switching device having a control terminal and first and second output terminals;

the potential setting circuit means comprises an eighth switching device having a control terminal and first and second output terminals; and the second output terminal of the eighth switching device being coupled to the control terminal of the seventh switching device, and to the first output terminal of the coupling/decoupling switching device.

3. The circuitry of claim 1 wherein the delay circuit means comprises the first and third inverter circuits, the output terminal of the third inverter circuit serves as the second terminal of the delay circuit means, and the input terminal of the first inverter circuit serves as the first terminal of the delay circuit means.

4. The circuitry of claim 2 further comprising:

a fourth inverter circuit having first and second input terminals and an output terminal;

the first input terminal of the fourth inverter circuit being coupled to the output terminal of the first inverter circuit;

the output terminal of the fourth inverter circuit being coupled to the first and second output terminals of the seventh switching device; and the second input terminal of the fourth inverter circuit being coupled to the output terminal of the second inverter circuit.

5. The circuitry of claim 4 wherein the first and fourth inverter circuits comprise the delay circuit means, with the first terminal of the delay circuit means being the input terminal of the first inverter circuit, and with the output terminal of the fourth inverter circuit being the second terminal of the delay circuit means.

6. The circuitry of claim 5 wherein:

the fourth inverter circuit comprises ninth and tenth switching devices which each comprise a control terminal and first and second output terminals;

the control terminal of the tenth switching device being coupled to the output terminal of the first inverter circuit;

the control terminal of the ninth switching device being coupled to the second output terminal of the third switching device; and the second output terminal of the ninth switching device and the first output terminal of the tenth switching device being coupled to the first and second output terminals of the seventh switching device.

7. The circuitry of claim 6 further comprising:

a second capacitor circuit means having a first terminal coupled to the circuitry input terminal and having a second terminal coupled to the control terminal of the third switching device;

eleventh and twelfth switching devices each having a control terminal and first and second output terminals;

the second output terminal of the eleventh switching device being coupled to the control terminal of the third switching device; and the second output terminal of the twelfth switching device being coupled to the output terminal of the third inverter circuit.

8. The circuitry of claim 7 wherein:

the second capacitor circuit means comprises a thirteenth switching device having a control terminal and first and second output terminals;

the control terminal of the thirteenth switching device being coupled to the control terminal of the third switching device; and the first and second output terminals of the thirteenth switching device being coupled together to the circuitry input terminal.

9. The circuitry of claim 8 wherein all switching devices are field effect transistors.

10. The circuitry of claim 9 wherein:

the second, third, fourth, fifth, sixth, ninth, tenth, and eleventh transistors are n-channel type enhancement mode insulated gate field effect transistors, and the coupling/decoupling transistor, the first, seventh, eighth, twelfth, and thirteenth transistors are n-channel type depletion mode insulated gate field effect transistors, wherein each of said transistors has a drain as the first output terminal thereof and a source as the second output terminal thereof;

the gate of the transistor which comprises the coupling/decoupling switching device is coupled to the source thereof;

the seventh switching device has the drain and source thereof coupled together and serving as the second terminal of the first capacitor circuit means and has the gate thereof serving as the first terminal of the first capacitor circuit means;

the thirteenth switching device has the drain and source thereof coupled together and serving as the second terminal of the second capacitor means and has the gate thereof serving as the first terminal of the second capacitor circuit means;

the eighth switching device has the gate thereof coupled to the output terminal of the first inverter circuit; and the transistor which comprises the twelfth switching device has the gate and source thereof coupled together.

11. The circuitry of claim 10 further comprising a row-address-decoder circuit having an output terminal coupled to the circuitry input terminal.

12. Circuitry comprising:

a first inverter circuit having an input terminal and an output terminal;

a second inverter circuit having first and second input terminals and an output terminal;

a first capacitor circuit means having first and second terminals;

a potential setting circuit means coupled to the first terminal of the capacitor circuit means for selectively setting the potential thereof to a first preselected level;

the input terminal of the first inverter circuit and the first input terminal of the second inverter circuit being coupled to a circuitry input terminal;

the output terminal of the first inverter circuit being coupled to the second input terminal of the second inverter circuit;

delay circuit means being coupled by a first terminal to the input terminal of the first inverter circuit and being coupled by a second terminal to the second terminal of the capacitor circuit means; and a coupling/decoupling switching device having a control terminal and first and second output terminals, the first output terminal thereof being coupled to the first terminal of the capacitor circuit means and the second output terminal thereof being coupled to the output terminal of the first inverter circuit and to the second input terminal of the second inverter circuit and the control terminal thereof being connected to a potential source that allows an increase in potential on the first terminal of the capacitor circuit means to be coupled to the second output terminal of the switching device, and wherein said first inverter includes a switching device (T22, T220) that is connected to the output terminal of said first inverter and to a voltage source (VDD) that tends to bias said coupling-/decoupling switching device towards conduction.

13. The circuitry of claim 12 wherein said coupling-/decoupling switching device is a depletion mode insulated gate field effect transistor having a source and a drain, wherein the gate thereof is connected to the source thereof.

14. The circuitry of claim 12 wherein said coupling-/decoupling switching device is an enhancement mode insulated gate field effect transistor having a source and a drain, wherein the gate thereof is connected to the drain thereof.

15. The circuitry of claim 12 wherein said coupling-/decoupling switching device is an enhancement mode insulated gate field effect transistor wherein a voltage pulse circuitry is said potential source.

* * * * *